US012696794B2

(12) United States Patent
Chao et al.

(10) Patent No.: US 12,696,794 B2
(45) Date of Patent: Jul. 28, 2026

(54) INTEGRATED CIRCUIT STRUCTURE AND MANUFACTURING METHOD THEREOF

(71) Applicant: Taiwan Semiconductor Manufacturing Company, Ltd., Hsinchu (TW)

(72) Inventors: Yung-Ching Chao, Yunlin County (TW); Wei-Han Chiang, Hsinchu (TW); Peng-Yuan Jung, Hsinchu (TW); Chin-Wei Kang, Tainan City (TW); Cheng-Jen Lin, Kaohsiung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1186 days.

(21) Appl. No.: 17/461,984

(22) Filed: Aug. 30, 2021

(65) Prior Publication Data

US 2023/0063726 A1 Mar. 2, 2023

(51) Int. Cl.
H10W 74/10 (2026.01)
H10W 20/20 (2026.01)
(Continued)

(52) U.S. Cl.
CPC ......... H10W 74/147 (2026.01); H10W 20/20 (2026.01); H10W 20/211 (2026.01); H10W 20/222 (2026.01); H10W 20/233 (2026.01); H10W 42/00 (2026.01); H10W 70/60 (2026.01); H10W 70/611 (2026.01); (Continued)

(58) Field of Classification Search
CPC ............... H01L 23/3192; H01L 23/481; H01L 23/5383; H01L 23/5384; H01L 2224/02331; H01L 2224/0401; H01L 2224/05022; H10W 70/60; H10W 70/611; H10W 70/62; H10W 70/635; H10W 70/67; H10W 70/685–687; H10W 72/29; H10W 72/923; H10W 72/9415; H10W 74/147; H10W 20/20; H10W 20/211; H10W 20/222; H10W 20/233
See application file for complete search history.

(56) References Cited

U.S. PATENT DOCUMENTS 8,987,922 B2 3/2015 Yu et al.
9,196,532 B2 11/2015 Tu et al.
(Continued)

FOREIGN PATENT DOCUMENTS

CN 102918637 2/2013
CN 103035600 4/2013
(Continued)

OTHER PUBLICATIONS

"Office Action of China Counterpart Application", issued on Jan. 20, 2026, p. 1-p. 8.

*Primary Examiner* — Marcos D. Pizarro
(74) *Attorney, Agent, or Firm* — JCIPRNET

(57) ABSTRACT

An integrated circuit structure includes a semiconductor substrate, a passivation layer, a first protective layer, and a second protective layer. The passivation layer is over the semiconductor substrate. The first protective layer is over the passivation layer. The second protective layer is over the first protective layer, wherein a boundary of the first protective layer is confined within the second protective layer.

20 Claims, 12 Drawing Sheets

(51) Int. Cl.

| | |
|---|---|
| *H10W 42/00* | (2026.01) |
| *H10W 70/60* | (2026.01) |
| *H10W 70/62* | (2026.01) |
| *H10W 70/63* | (2026.01) |
| *H10W 70/65* | (2026.01) |
| *H10W 70/67* | (2026.01) |
| *H10W 70/685* | (2026.01) |
| *H10W 72/00* | (2026.01) |
| *H10W 72/20* | (2026.01) |
| *H10W 72/29* | (2026.01) |
| *H10W 72/90* | (2026.01) |
| *H10W 74/01* | (2026.01) |

(52) U.S. Cl.
CPC ......... *H10W 70/62* (2026.01); *H10W 70/635* (2026.01); *H10W 70/65* (2026.01); *H10W 70/67* (2026.01); *H10W 70/685* (2026.01); *H10W 70/686* (2026.01); *H10W 70/687* (2026.01); *H10W 72/01938* (2026.01); *H10W 72/29* (2026.01); *H10W 72/923* (2026.01); *H10W 72/9415* (2026.01); *H10W 74/01*

(2026.01); *H10W 72/01257* (2026.01); *H10W 72/252* (2026.01); *H10W 72/952* (2026.01)

(56) References Cited

U.S. PATENT DOCUMENTS

| | | | |
|---|---|---|---|
| 9,196,559 B2 | 11/2015 | Tsai et al. | |
| 9,257,333 B2 | 2/2016 | Lu et al. | |
| 9,263,839 B2 | 2/2016 | Chen et al. | |
| 9,275,924 B2 | 3/2016 | Wang et al. | |
| 9,275,925 B2 | 3/2016 | Chen et al. | |
| 9,281,254 B2 | 3/2016 | Yu et al. | |
| 9,372,206 B2 | 6/2016 | Wu et al. | |
| 9,496,189 B2 | 11/2016 | Yu et al. | |
| 11,081,391 B2* | 8/2021 | Chen ..................... | H01L 24/10 |
| 2009/0243097 A1* | 10/2009 | Koroku .............. | H01L 23/3135 |
| | | | 257/737 |

FOREIGN PATENT DOCUMENTS

| | | |
|---|---|---|
| CN | 103247593 | 8/2013 |
| CN | 104051429 | 9/2014 |

* cited by examiner

INTEGRATED CIRCUIT STRUCTURE AND MANUFACTURING METHOD THEREOF

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
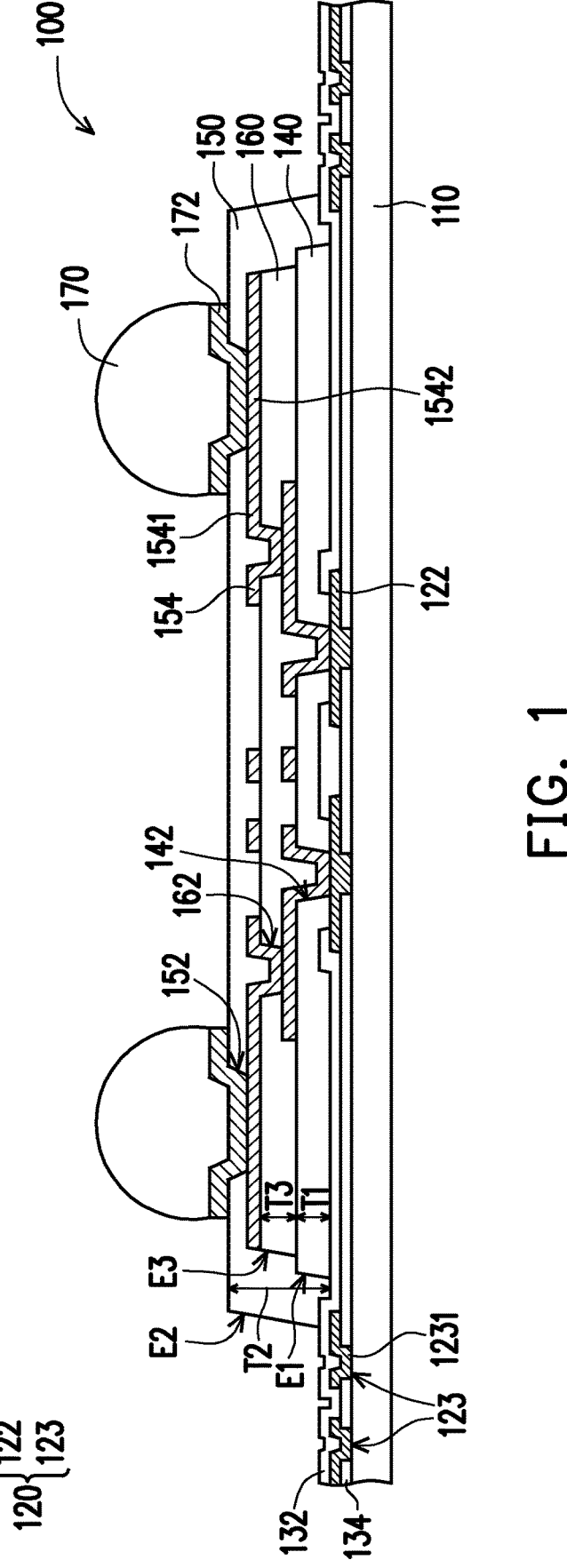
FIG. 1 illustrates a schematic cross sectional view of an integrated circuit structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit structure and the method of forming the same are provided in accordance with various exemplary embodiments. Before addressing the illustrated embodiments specifically, some advantageous features and aspects of the present disclosed embodiments will be addressed generally. The integrated circuit structure may be adopted for improving issues of delamination between overlying protective (polymer) layer and underlying dielectric (passivation) layer during manufacturing process. Described below is a structure having an uppermost protective layer covering underlying protective layers and interfaces between the protective layers and passivation layers. Correspondingly, by covering interfaces between the underlying layers, the overlying protective layer can block the moisture penetration path and may substantially eliminate any moisture penetration, which would cause moisture-induced degradation and delamination between layers. The intermediate stages of forming the integrated circuit structure are illustrated in accordance with some embodiments. Some variations of some embodiments are discussed. Throughout the various views and illustrative embodiments, like reference numbers are used to designate like elements.

Figure 2:
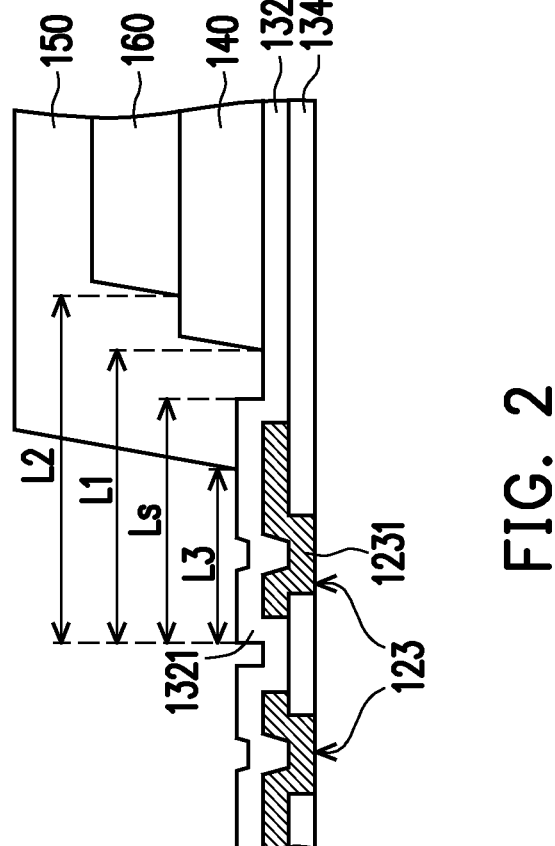
FIG. 2 illustrates a partial enlarged view of an integrated circuit structure according to some embodiments of the present disclosure.

FIG. 1 illustrates a schematic cross sectional view of an integrated circuit structure according to some embodiments of the present disclosure. FIG. 2 illustrates a partial enlarged view of an integrated circuit structure according to some embodiments of the present disclosure. With now reference to FIG. 1 and FIG. 2, in some embodiments, there is shown an integrated circuit structure 100 with a semiconductor substrate 110, at least one conductive layer 120, at least one passivation layer 132, a (first) protective layer 140, and a (second) protective layer 150. The semiconductor substrate 110 may include bulk silicon, doped or undoped, or an active layer of a silicon-on-insulator (SOI) substrate. Generally, an SOI substrate includes a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Various active devices and/or passive devices may be formed either within or else on the semiconductor substrate 110. An interconnection structure including metallization layers and inter metal dielectric (IMD) layers (e.g., the metallization layers 115 and IMD layers 114 shown in FIG. 3) can be formed on the semiconductor substrate 110 to connect the various active devices and/or passive devices, resulting in functional circuitry. In some embodiments, the integrated circuit structure 100 may be a semiconductor wafer including a plurality of semiconductor dies. In other embodiments, the integrated circuit structure 100 may be a portion of a semiconductor wafer, such as one of the semiconductor dies after singularization process. The disclosure is not limited thereto.

In accordance with some embodiments of the disclosure, the conductive layer 120 may include at least one conductive pad 122 (two conductive pads 122 are illustrated, but not limited thereto) formed on the upper-most dielectric layer (e.g., IMD layers 114 in FIG. 3) and connected the upper-most metallization layer of the interconnect structure over the semiconductor substrate 110. The conductive pads 122 may include aluminum, but other materials, such as copper, may alternatively be used. In some embodiments, the passivation layer 132 partially covers the conductive layer 120. For example, the passivation layer 132 is formed on the semiconductor substrate 110 over the interconnection structure and then patterned with an opening to reveal a portion of each of the conductive pads 122. The passivation layer 132 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. In some embodiments, the term "passivation layer" refers to the dielectric layers over dual damascene structures, wherein the metal features in the passivation layer are not formed using damascene processes. However, the disclosure is not limited thereto.

In some embodiments, the first protective layer 140 is formed over the passivation layer 132 and patterned with at least one opening pattern 142 to reveal a portion of each of the conductive pads 122. The opening pattern 142 extending through the first protective layer 140 allows for electrical contact between the conductive pads 122 and overlying conductive layers (e.g., conductive layers 144, 154). The first protective layer 140 may be made of one or one more suitable polymer materials such as epoxy, polyimide, benzocyclobutene (BCB), polybenzoxazole (PBO), and the like, although other relatively soft, often organic, dielectric materials can also be used. Alternatively, the first protective layer 140 may be formed of a material similar to the material used as the passivation layer 1132, such as silicon oxides, silicon nitrides, low-k dielectrics, extremely low-k dielectrics, combinations of these, and the like.

In some embodiments, a conductive layer 154 is a patterned metallization layer and may be formed over the first protective layer 140. In some embodiments, the conductive layer 154 may be referred to as a post passivation interconnects (PPI) layer and electrically connected to the conductive pads 122 through, for example, the opening 142 in the first protective layer 140. In some embodiments, the conductive layer 154 may include at least one of a copper (Cu) layer, an aluminum (Al) layer, a copper alloy layer, a nickel layer, a gold layer, or other mobile conductive materials. In some embodiments, the conductive layer 154 may function as power lines, re-distribution lines (RDL), inductors, capacitors or any passive components. In an embodiment, the conductive layer 154 includes an interconnect line region 1541 and a landing pad region 1542, and a conductive bump 170 may be formed over and electrically connected to the landing pad region 1542 in subsequent processes. In an embodiment, the landing pad region 1542 is not directly over the conductive pad 122 as depicted in FIG. 1. In other embodiments, the landing pad region 1542 is directly over the conductive pad 122.

In accordance with some embodiments of the disclosure, the second protective layer 150 is formed over the first protective layer 140. In some embodiments, the second protective layer 150 is formed over the conductive layer 154 and reveals the landing pad region 1542 of the conductive layer 154. For example, the second protective layer 150 is patterned to form at least one opening pattern 152 to reveal a portion of the landing pad region 1542 of the conductive layer 154. The second protective layer 150 may be made of one or one more suitable polymer materials such as epoxy, polyimide, benzocyclobutene (BCB), polybenzoxazole (PBO), and the like, although other relatively soft, often organic, dielectric materials can also be used. In some embodiments, the second protective layer 150 is formed of a material similar to or the same as the material used as the first protective layer 140. In some embodiments, a boundary (e.g., a contour of the outer edge E1) of the first protective layer 140 is confined within the second protective layer 150. In other words, the first protective layer 140 is completely overlapped with the second protective layer 150 in a top view.

In some embodiments, the second protective layer 150 covers the first protective layer 140 and an interface between the first protective layer 140 and the passivation layer 132. That is, the second protective layer 150 is in contact with an outer edge (outer side wall) E1 of the first protective layer 140 and covers the interface between the first protective layer 140 and the passivation layer 13 where moisture can easily permeate through. In general, the interface between the protective layers 140 and the passivation layers 132 has poor adhesion and suffers moisture attack, which may induce delamination in protective (polymer) layers. Accordingly, by covering the interface between the first protective layer 140 and the passivation layer 132, the second protective layer 150 blocks the moisture penetration path and may substantially eliminate any moisture penetration, which may cause moisture-induced degradation and delamination issues in the protective layers. In addition, the second protective layer 150 may further prevent moisture from reaching the conductive layer 120 (e.g., the conductive pads 122), which is confined within the passivation layer 132.

In one of the implementations, the integrated circuit structure 100 may further include a third protective layer 160 disposed between the first protective layer 140 and the second protective layer 150. For example, the third protective layer 160 is formed over the first protective layer 140 and patterned with an opening pattern 162 for revealing a portion of the conductive layer 144 over the first protective layer 140. In some embodiments, the conductive layer 154 may be formed over the third protective layer 160 and covers the opening pattern 162 to electrically connect the conductive layer 144 underneath. In some embodiments, an outer edge E3 of the third protective layer 160 is in a stair step relationship with an outer edge E1 of the first protective layer 140. In other words, the outer edge E1 of the first protective layer 140 may extend horizontally further toward a die edge of the integrated circuit structure 100 than the outer edge E3 of the third protective layer 160, thereby creating a tapered or stair-step effect between the first protective layer 140 and the third protective layer 160. The third protective layer 160 may be made of one or one more suitable polymer materials such as epoxy, polyimide, benzocyclobutene (BCB), polybenzoxazole (PBO), and the like, although other relatively soft, often organic, dielectric materials can also be used. In some embodiments, the third protective layer 160 is formed of a material similar to or the same as the material used as the protective layers 140, 150. A major thickness T1/T2/T3 of each of the protective layers 140, 150, 160 may range from 1 μm to 20 μm, and the thicknesses T1, T2, T3 of the protective layers 140, 150, 160 may be the same as or different from one another. The disclosure is not limited thereto.

In such arrangement, a boundary (e.g., a contour of the outer edge E3) of the third protective layer 160 is also confined within the second protective layer 150. That is to say, the third protective layer 160 reveals a periphery of the first protective layer 140, which is covered by the second passivation layer 150. Accordingly, the second protective layer 150 is in contact with the outer edge E3 of the third protective layer 160 and covers an interface between the first protective layer 140 and the third protective layer 1602. In some embodiments, an outer edge E2 of the second protective layer 150 is an inclined planar surface extended from an upper surface of the second protective layer 150 to the passivation layer 132. With such configuration, the second protective layer 150 covers the interfaces between the protective layers 140 and 160 and the interface between the protective layer 140 and the passivation layer 132, which may suffer moisture attack and moisture-induced degradation and delamination. Therefore, by covering the interfaces between the protective layers 140, 160 and the passivation layer 132 with the second protective layer 150, such configuration reduces the number of the interfaces where moisture may permeate through and blocks the moisture penetration path, so as to improve issues of moisture-induced degradation and delamination issues in the protective layers 140 and 160. It is noted that the current disclosure does not limit the numbers of the protective layers stacked over the semiconductor substrate 110 as long as the uppermost protective layer (e.g., protective layer 150) covers outer edges of other protective layers (e.g., protective layers 140, 160) underneath.

In accordance with some embodiments of the disclosure, an under bump metallization (UBM) layer 172 is formed over the second protective layer 150 and cover the revealed portion of the landing pad region 1542. In an embodiment, the under bump metallization layer 172 is formed along the bottom and sidewalls of the opening pattern 152 in the second protective layer 150 and extends to an upper surface of the second protective layer 150 to a predetermined distance. In an embodiment, the under bump metallization layer 172 includes at least one conductive layer formed of titanium, titanium, titanium copper, nickel or alloys thereof. Any suitable conductive materials or combination of different layers of material that may be used for the under bump metallization layer 172 are intended to be included within the scope of the current disclosure. The under bump metallization layer 172 may be created by forming each layer over the second protective layer 150 and the opening pattern 152 of the second protective layer 150. The forming of the under bump metallization layer 172 may be performed using a plating process, such as electrochemical plating, although other processes of formation, such as sputtering, evaporation, or plasma enhanced chemical vapor deposition (PECVD) process, may alternatively be used depending upon the desired materials. Once the desired layers have been formed, portions of the under bump metallization layer 172 may then be removed through a suitable photolithographic masking and etching process to remove the undesired material and to leave the under bump metallization layer 172 in a desired shape, such as a circular, octagonal, square, or rectangular shape, although any desired shape may alternatively be formed.

In accordance with some embodiments of the disclosure, a plurality of conductive bumps 170 (two conductive bumps 170 are illustrated herein but not limited thereto) are formed over the under bump metallization layer 172 and partially embedded in the opening pattern 152 of the second protective layer 150. The conductive bumps 170 are electrically connected to the metal layer 120 for external electrical connection. In one of the implementations, the conductive bumps 170 may be directly disposed on the second protective layer 150 (through the under bump metallization layer 172), which means the second protective layer 150 is the uppermost protective layer. The disclosure does not limit the numbers of the protective layers stacked over one another as long as the uppermost protective layer covers outer edges of other protective layers underneath. The conductive bumps 170 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. In one embodiment, the conductive bumps 170 may include a conductive material such as solder, copper, aluminum, gold, nickel, silver, palladium, tin, the like, or a combination thereof. In some embodiments, the connectors comprise a eutectic material and may comprise a solder bump or a solder ball, as examples. The conductive bumps 170 may be formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes.

With now reference to FIG. 2, in some embodiments, the semiconductor substrate 110 is provided with a seal ring region and a circuit region. In an embodiment, the seal ring region surrounds the circuit region, and the seal ring region is for forming at least one seal ring (e.g., sealing rings 123) thereon and the circuit region is for forming circuits (e.g., metal layer 120) and/or at least one transistor device therein. That is, an integrated circuit is formed over the circuit region and a seal ring structure is formed over the seal ring region. In some embodiments, the integrated circuit structure 100 may be a semiconductor wafer, which includes a plurality of integrated circuits (e.g., dies) and a plurality of adjoining scribe line. In each of dies, at least one seal ring (two seal rings 123 are illustrated, but not limited thereto) may be formed over a periphery of the semiconductor substrate 110. In one of the embodiments, an outer seal ring (alternatively referred to as a sacrificial seal ring) is closer to the scribe line SL than an inner seal ring (alternatively referred to as a main seal ring) is. The structure as shown in FIG. 1 and FIG. 2 may be a part of a wafer that includes a plurality of dies and a plurality of scribe lines.

In some embodiments, each of the seal rings 123 includes a plurality of metal lines and vias formed in low-k dielectric layers. As is known in the art, the lower metal lines may be formed using a single damascene process, while upper metal lines may be formed using dual damascene processes along with the underlying vias. In some embodiments, the seal ring 123 may further include a conductive ring (alternatively referred to as aluminum pad (AP), or pad ring throughout the description) 1231 over, and physically connected to, the metal line underneath. The conductive ring 1231 may include a portion over passivation layer 134, and a portion penetrating into passivation layer 134. The passivation layer 132 is formed over the passivation layer 134 and the conductive ring 1231. In one embodiment, the passivation layer 132 may be formed conformally over the conductive ring 1231. For example, the passivation layer 132 disposed over the seal ring 123 includes a protruded portion 1321 that covers and conforms to a contour of the seal ring 123 (e.g., conductive ring 1231). By forming the passivation layer 132 conformally, the passivation layer 132 may have two upper surfaces: one is an upper surface of the protruded portion 1321 located above the tops of the conductive ring 1231, and the other one is an upper surface of the rest of the passivation layer 132 located below the tops of the conductive ring 1231. The passivation layers 132, 134 may be formed of oxides, nitrides, and combinations thereof, and may be formed of the same or different materials. The conductive ring 1231 may be formed simultaneously with the formation of conductive pads 122 (shown in FIG. 1) that are formed on the semiconductor substrate 110. That is to say, the metal layer 120 includes the conductive pads 122, and the conductive ring 1231 of the seal ring 123.

With such configuration, in some embodiments, the first protective layer 140 is spaced apart from the protruded portion 1321 of the passivation layer 132, and the second protective layer 150 covers a part of the protruded portion 1321 and a part of the passivation layer 132 that is between the first protective layer 140 and the protruded portion 1321. In other words, the second protective layer 150 is (partially) overlapped with the (inner) sealing ring 123 and the protruded portion 1321 of the passivation layer 132 from a top view. That is, the seal ring 123 is overlapped with the periphery of the passivation layer 132 and covered by the second protective layer 150 from a top view. Accordingly, by extending the coverage (footprint) of the second protective layer 150 to be overlapped with the sealing ring 123, a boundary of the second protective layer 150 is further away from the interface between the first protective layer 140 and the passivation layer 132. Accordingly, the issues of moisture penetration, which may cause moisture-induced degradation and delamination in the protective layers, can be further improved.

By taking an outer edge of the protruded portion 1321 of the passivation layer 132 as a reference point, the relative positions of the protective layers 140, 150, 160 and the passivation layers 132, 134 can be established. For example, in one of the implementations, a distance L1 from the reference point to a boundary (outer edge) of the first protective layer 140 is substantially smaller than a distance L2 from the reference point to a boundary of the third protective layer 160. In one embodiment, the difference between the distance L2 and the distance L1 is substantially greater than 1 μm. Meanwhile, the distance L1 may also be substantially greater than a distance LS from the reference point to an inner edge of the protruded portion 1321. That means the boundary of the first protective layer 140 is located between the boundaries of the third protective layer 160 and the protruded portion 1321 of the passivation layer 132 from a top view. In some embodiments, the distance LS is substantially greater than a distance from the reference point to a boundary (outer edge) of the second protective layer 150. That means, the second protective layer 150 would at least covers (overlap with) an inner edge of the protruded portion 1321 of the passivation layer 132. In some embodiments, the width of the protruded portion 1321 of the passivation layer 132 (distance LS) substantially ranges from 3 μm to 20 μm. One skilled in the art will realize, however, that the dimensions recited throughout the description are merely examples, and will change if different formation technologies and equipment are used. The recitation of a particular numerical value or value range herein is understood to include or be a recitation of an approximate numerical value or value range (e.g., within +/−20%, +/−10%, or +/−5%).

FIG. 3 to FIG. 11 illustrate cross sectional views of intermediate stages in the manufacturing of an integrated circuit structure according to some embodiments of the present disclosure. One of the manufacturing processes for forming the integrated circuit structure 100 described above may include the following steps. With now reference to FIG. 3, in some embodiments, the semiconductor substrate 110 is provided. The semiconductor substrate 110 may include a substrate 111, an electrical circuitry 112, an inter-layer dielectric (ILD) layer 113, inter-metal dielectric (IMD) layers 114 and the associated metallization layers 115. It is noted that the semiconductor substrate 110 described herein are illustrated in an abstract form as a block in FIG. 4 to FIG. 11 for convenience of illustration.

In some embodiments, the substrate 111 may include, for example, bulk silicon, doped or undoped, or an active layer of a semiconductor-on-insulator (SOI) substrate. The semiconductor substrate 110 may be provided as a wafer level scale or a chip level scale. Other substrates, such as a multi-layered or gradient substrate may also be used. In some embodiments, electrical circuitry 112 formed on the substrate 111 may be any type of circuitry suitable for a particular application. In an embodiment, the electrical circuitry 112 includes electrical devices formed on the substrate with one or more dielectric layers overlying the electrical devices. Metal layers may be formed between dielectric layers to route electrical signals between the electrical devices. Electrical devices may also be formed in one or more dielectric layers. For example, the electrical circuitry 112 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

The ILD layer 113 may be formed, for example, of a low-K dielectric material, such as phosphosilicate glass (PSG), borophosphosilicate glass (BPSG), fluorinated silicate glass (FSG), SiOxCy, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). In some embodiments, the ILD layer 113 may include a plurality of dielectric layers. Contacts (not shown) may be formed through the ILD layer 113 to provide an electrical contact to the electrical circuitry 112.

One or more inter-metal dielectric (IMD) layers 114 and the associated metallization layers are formed over the ILD layer 113. Generally, the one or more IMD layers 114 and the associated metallization layers 115 are used to interconnect the electrical circuitry 112 to each other and to provide an external electrical connection. The IMD layers 114 may be formed of a low-K dielectric material, such as FSG formed by PECVD techniques or high-density plasma CVD (HDPCVD), or the like, and may include intermediate etch stop layers. In some embodiments, one or more etch stop layers (not shown) may be positioned between adjacent ones of the dielectric layers, e.g., the ILD layer 113 and the IMD layers 114. Generally, the etch stop layers provide a mechanism to stop an etching process when forming vias and/or contacts. The etch stop layers are formed of a dielectric material having a different etch selectivity from adjacent layers, e.g., the underlying substrate 111, the overlying ILD layer 113, and the overlying IMD layers 114. In an embodiment, etch stop layers may be formed of SiN, SiCN, SiCO, CN, combinations thereof, or the like, deposited by CVD or PECVD techniques.

In some embodiments, the metallization layers 115 including metal lines and vias may be formed of copper or copper alloys, or of other metals. Further, the metallization layers 115 include a top metal layer 116 formed and patterned in or on the uppermost IMD layer to provide external electrical connections and to protect the underlying layers from various environmental contaminants. In some embodiments, the uppermost IMD layer may be formed of a dielectric material, such as silicon nitride, silicon oxide, undoped silicon glass, and the like. In subsequent drawings, the substrate 111, the electrical circuitry 112, the ILD layer 113, the IMD layer 114, and the metallization layers 115 are not illustrated. In some embodiments, the top metal layer 116 is formed as a part of the top metallization layer on the uppermost IMD layer.

Figures 3, 4:
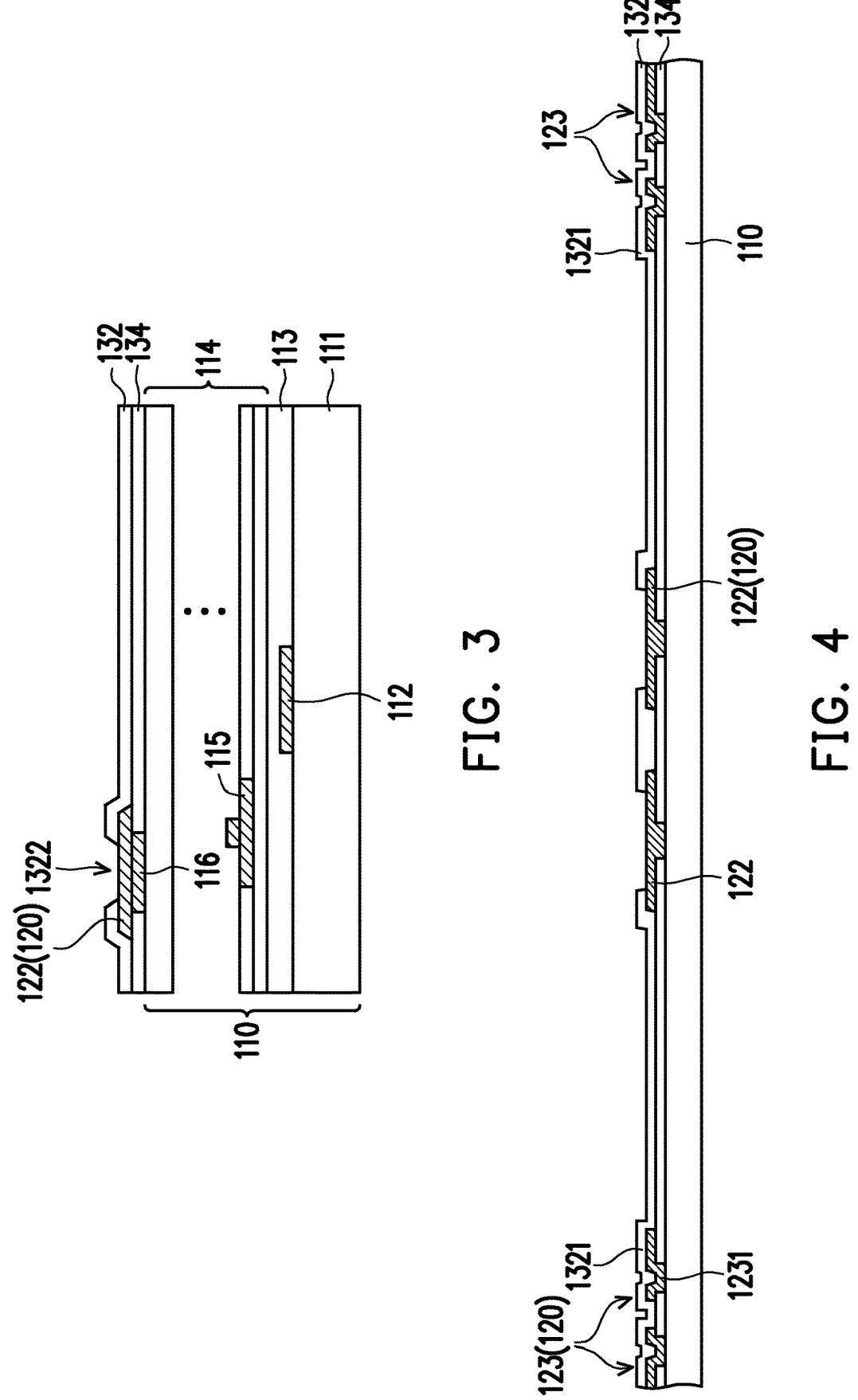
FIG. 3 to FIG. 11 illustrate cross sectional views of intermediate stages in the manufacturing of an integrated circuit structure according to some embodiments of the present disclosure.

Referring to FIG. 3 and FIG. 4, in some embodiments, the metal layer 120 including the conductive pads 122 and the conductive ring 1231 of the seal ring 123 is formed over the semiconductor substrate 110. In some embodiments, the conductive pads 122 are patterned to contact the top metal layer 116, or alternatively, electrically coupled to top metal layer 116 through a via. In some embodiments, the conductive pads 122 may be formed of aluminum, aluminum copper, aluminum alloys, copper, copper alloys, or the like. One or more passivation layers, such as a passivation layers 132, 134 are formed and patterned over the conductive pads 122 of the metal layer 120. In some embodiments, the passivation layers 132, 134 may be formed of a dielectric material, such as undoped silicate glass (USG), silicon nitride, silicon oxide, silicon oxynitride or a non-porous material by any suitable method, such as CVD, PVD, or the like. In one embodiment, the passivation layer 132 is formed to partially cover the metal layer 120. For example, the passivation layer 132 may be formed to cover the peripheral portion of the conductive pads 122, and to expose the central portion of conductive pads 122 through the opening pattern 1322 in passivation layer 132. The passivation layer 132 may also conformally formed over the seal ring 123. For example, the passivation layer 132 disposed over the seal ring 123 includes a protruded portion 1321 that covers and conforms to a contour of the seal ring 123. The passivation layer may be a single layer or a laminated layer. In FIG. 3, a single layer of conductive pads 122 and multiple passivation layers 132, 134 are shown for illustrative purposes only. As such, other embodiments may include any number of conductive layers and/or passivation layers.

Figures 5, 6:
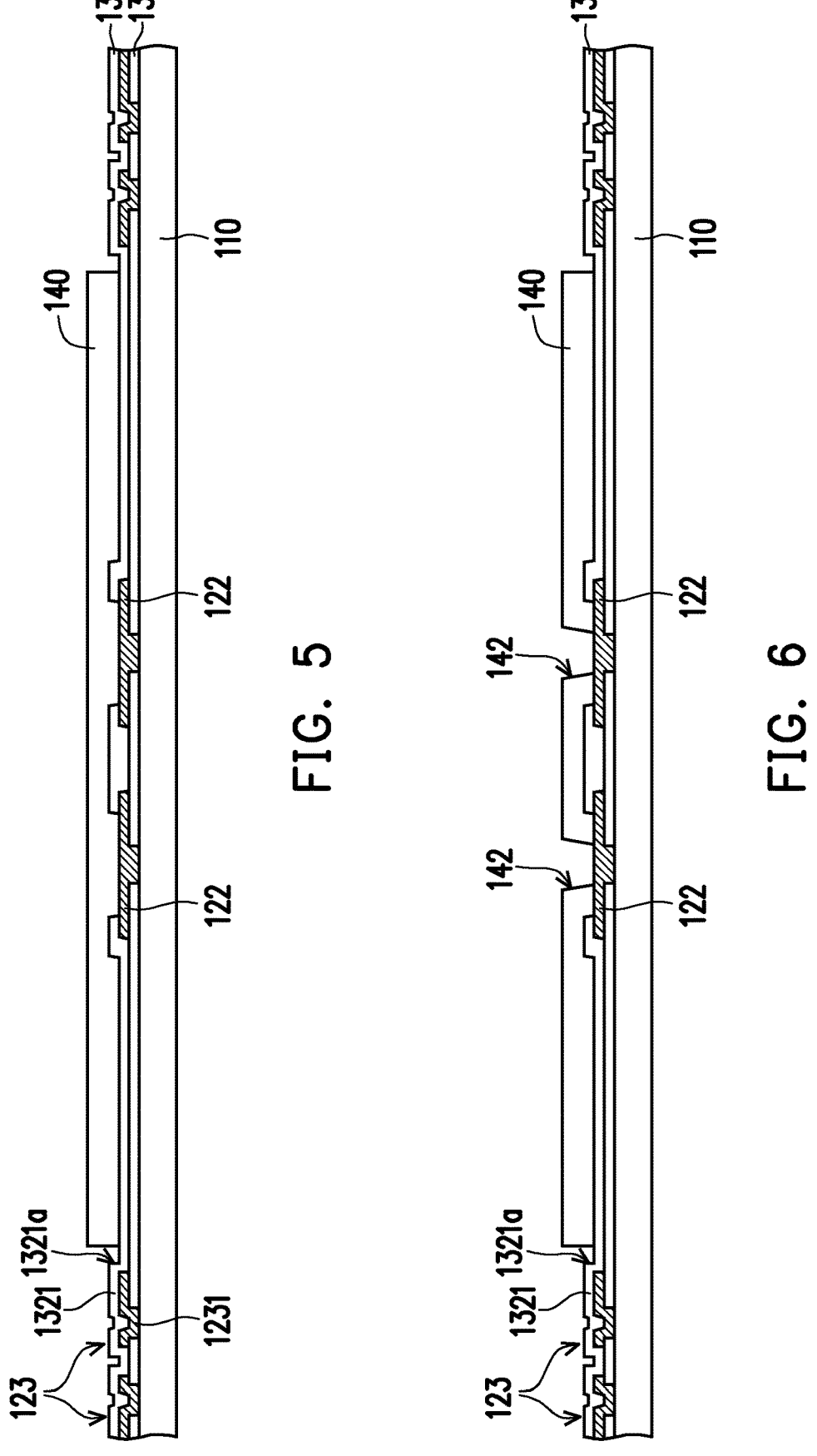

Referring to FIG. 5 and FIG. 6, next, a first protective layer 140 is formed over the passivation layer 132 by coating and patterning. In some embodiments, the first protective layer 140 may be, for example, a polymer layer, which is patterned to form at least one opening pattern 142 (two opening patterns are illustrated but not limited thereto), through which the conductive pads 122 is revealed. In some embodiments, the polymer layer may be formed of a polymer material such as an epoxy, polyimide, benzocyclobutene (BCB), polybenzoxazole (PBO), and the like, although other relatively soft, often organic, dielectric materials can also be used. The formation methods include spin coating or other methods. The first protective layer 140 has a thickness in a range between about 1 μm and about 20 μm. In some embodiments, referring to FIG. 2 and FIG. 6, the first protective layer 140 reveals (exposes) a periphery of the passivation layer 132. In one embodiment, a boundary of the first protective layer 140 is spaced apart from an inner edge 1321*a* of the protruded portion 1321 of the passivation layer 132. In other words, the first protective layer 140 at least reveals (exposes) the protruded portion 1321 of the passivation layer 132. In one embodiment, the first protective layer 140 is horizontally spaced apart form the conductive rings 123. In some embodiments, the first protective layer

140 may be formed (e.g., deposited, coating, etc.) on the central portion of the passivation layer 132 without covering the protruded portion 1321 of the passivation layer 132 as it is shown in FIG. 5, and then is patterned to form the opening patterns 142 as it is shown in FIG. 6. In other embodiment, the first protective layer 140 is formed to cover the entire passivation layer 132 including the protruded portion 1321, and then is patterned to form the opening patterns 142 and reveals the protruded portion 1321. Namely, the step illustrated in FIG. 5 may be optionally omitted.

Figures 7, 8:
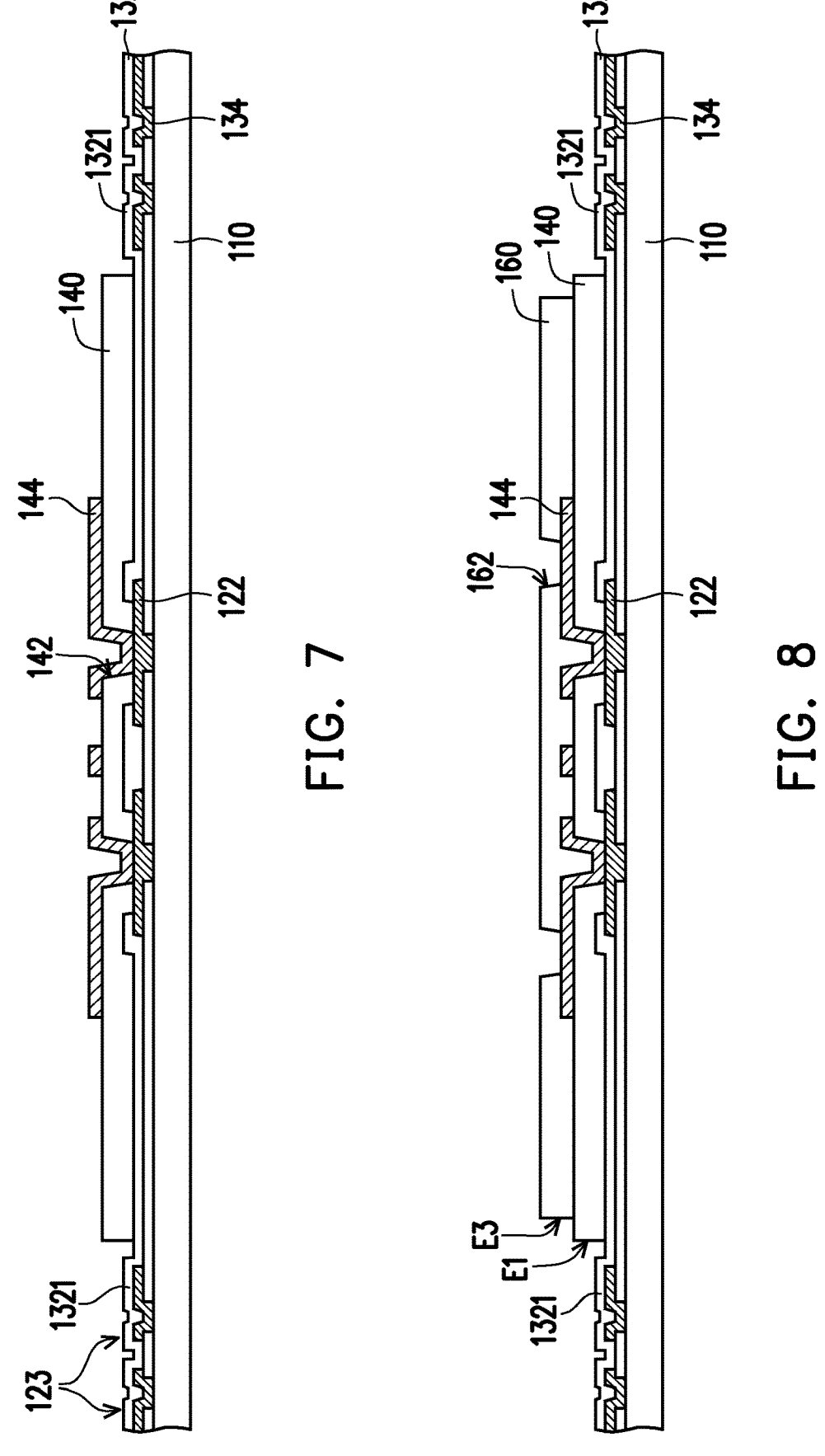

Referring to FIG. 7 and FIG. 8, then, at least one metallization layer is formed on the first protective layer 140 and fills the opening pattern 142 and then patterned as a conductive layer 144, which is electrically connected to the conductive pads 122 and may expose a portion of the underlying first protective layer 140. The third protective layer 160 is then formed over the first protective layer 140 to cover the interconnect layer 144. Using photolithography and/or etching processes, the third protective layer 160 is further patterned to form an opening pattern 162 exposing at least a portion of the interconnect layer 144. The formation methods of the opening pattern 162 may include lithography, wet or dry etching, laser drill, and/or the like. In some embodiments, the third protective layer 160 is formed of a polymer layer, such as an epoxy, polyimide, benzocyclobutene (BCB), polybenzoxazole (PBO), and the like, although other relatively soft, often organic, dielectric materials may also be used. In some embodiments, the third protective layer 160 is formed of a non-organic material selected from un-doped silicate glass (USG), silicon nitride, silicon oxynitride, silicon oxide, and combinations thereof. In some embodiments, an outer edge E3 of the third protective layer 160 is in a stair step relationship with an outer edge E1 of the first protective layer 140. In other words, the outer edge E1 of the first protective layer 140 may extend horizontally further toward the seal ring 123 than the outer edge E3 of the third protective layer 160, thereby creating a tapered or stair-step effect between the first protective layer 140 and the third protective layer 160.

Figure 9:
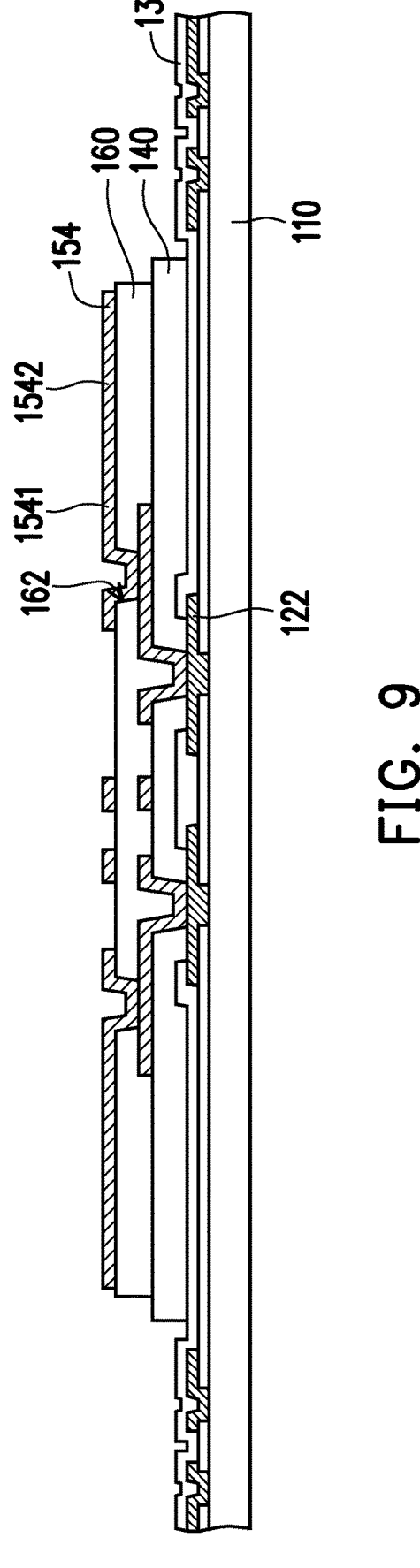

Referring to FIG. 9, then, at least one metallization layer is formed over the third protective layer 160 and fills the opening pattern 162 and then patterned as a conductive layer 154, which is electrically connected to the conductive pads 122 and may expose a portion of the underlying third protective layer 160. In at least an embodiment, the conductive layer 154 is a post-passivation interconnect (PPI) layer, which may also function as power lines, re-distribution lines (RDL), inductors, capacitors or any passive components. The conductive layer 154 includes an interconnect line region 1541 and a landing pad region 1542. In some embodiments, the interconnect line region 1541 and the landing pad region 1542 may be formed simultaneously, and may be formed of a same conductive material. A conductive bump will be formed over and electrically connected to the landing pad region 1542 in subsequent processes. In some embodiments, the conductive layer 154 may include copper, aluminum, copper alloy, or other mobile conductive materials using plating, electroless plating, sputtering, chemical vapor deposition methods, and the like. In one embodiment, the conductive layer 154 includes a copper layer or a copper alloy layer. In the embodiment of FIG. 8, the landing region 1542 is not directly over (right above) the conductive pad 122. In other embodiments, through the routing of the conductive layer 154, the landing pad region 1542 is directly over (right above) the conductive pad 122.

Figure 10:
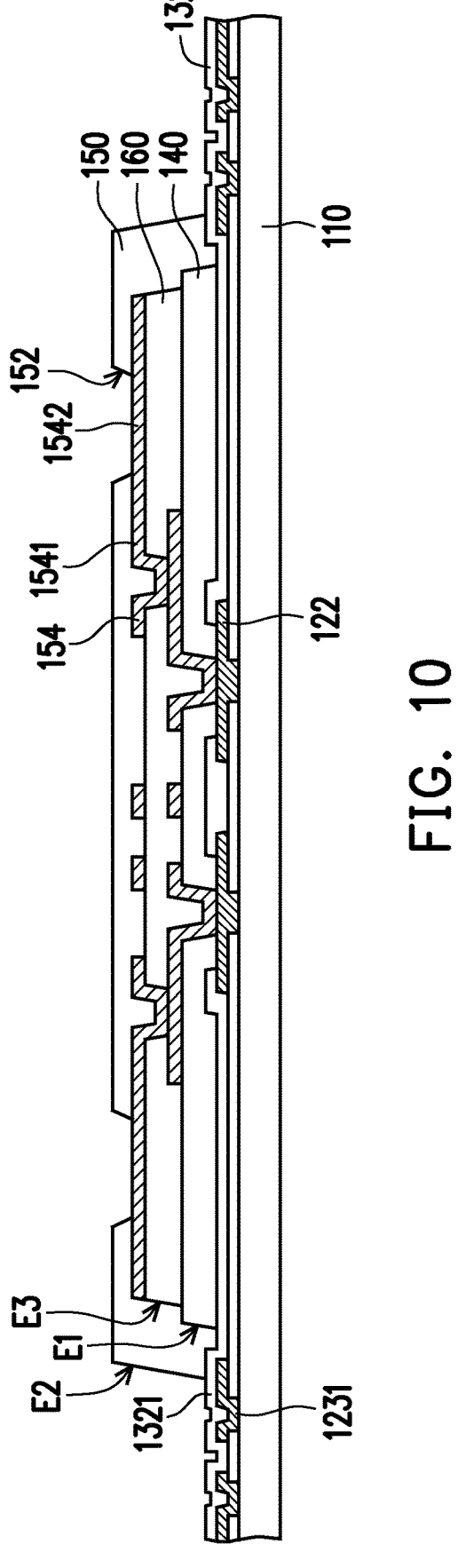

With reference to FIG. 10, the second protective layer 150 is thereafter formed on the third protective layer 160 to cover the conductive layer 154. Using photolithography and/or etching processes, the second protective layer 150 is further patterned to form an opening pattern 152 exposing at least a portion of the landing pad region 1542 of the conductive layer 154. The formation methods of the opening pattern 152 may include lithography, wet or dry etching, laser drill, and/or the like. In some embodiments, the second protective layer 150 is formed of a polymer layer, such as an epoxy, polyimide, benzocyclobutene (BCB), polybenzoxazole (PBO), and the like, although other relatively soft, often organic, dielectric materials may also be used. In some embodiments, the second protective layer 150 is formed of a non-organic material selected from un-doped silicate glass (USG), silicon nitride, silicon oxynitride, silicon oxide, and combinations thereof.

In some embodiments, the second protective layer 150 covers the first protective layer 140, the third protective layer 160 and a part of the periphery of the passivation layer 132 that is exposed by the first protective layer 140. Accordingly, the second protective layer 150 is in contact with the outer edge E3 of the third protective layer 160, the outer edge E1 of the first protective layer 140 and covers the interface between the protective layers 140, 160, and the interface between the protective layer 140 and the passivation later 132. The formation methods of the second protective layer 150 include spin coating or other methods. As such, an outer edge E2 of the second protective layer 150 is a slanted planar surface extended from an upper surface of the second protective layer 150 to the passivation layer 132. With such configuration, the second protective layer 150 covers the interfaces between the protective layers 140 and 160 and the interface between the protective layer 140 and the passivation layer 132, which may suffer moisture attack and moisture-induced degradation and delamination. Such configuration reduces the number of the interfaces where moisture may permeate through and blocks the moisture penetration path, so as to improve issues of moisture-induced degradation and delamination issues in the protective layers. It is noted that the current disclosure does not limit the numbers of the protective layers stacked over the semiconductor substrate 110 as long as the uppermost protective layer (e.g., protective layer 150) covers outer edges of other protective layers (e.g., protective layers 140, 160) underneath.

Figure 11:
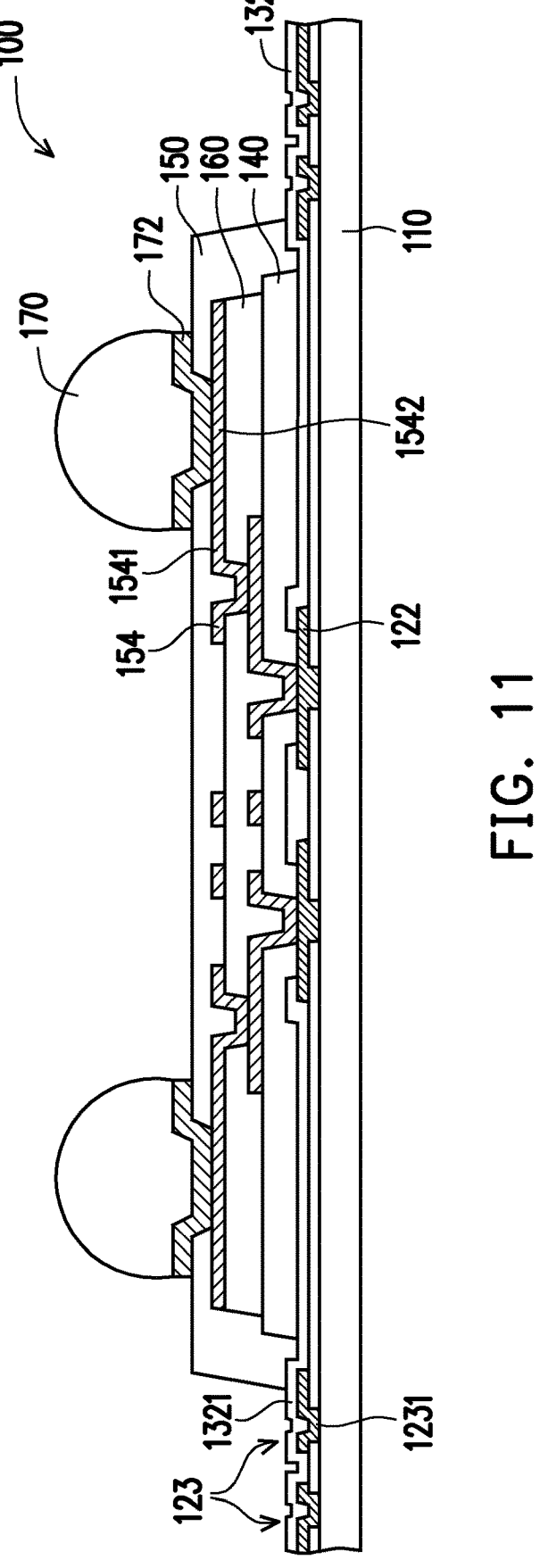

As shown in FIG. 11, the UBM layer 172 is formed over the second protective layer 150 and covers the exposed portion of the landing pad region 1542 so as to be electrically connected to the conductive layer 154. The UBM layer 172 is formed by using metal deposition methods. In some embodiments, the UBM layer 172 includes at least one metallization layer comprising titanium (Ti), tantalum (Ta), titanium nitride (TiN), tantalum nitride (TaN), copper (Cu), copper alloys, nickel (Ni), tin (Sn), gold (Au), or combinations thereof. In one embodiment, the UBM layer 172 may be a single layer or a composite layer, which may includes a Ti-containing layer and a Cu-containing layer. The disclosure is not limited thereto.

Thereafter, the conductive bumps 170 are formed on the UBM layer 172 to be electrically connected to the landing pad region 1542. The conductive bumps 170 can be a solder bump, a Cu bump or a metal bump including Ni or Au. In one embodiment, the conductive bump 170 is a solder bump formed by attaching a solder ball on the UBM layer 172 and then thermally reflowing the solder material. In some embodiments, the solder bump may include a lead-free pre-solder layer, SnAg, or a solder material including alloys of tin, lead, silver, copper, nickel, bismuth, or combinations thereof. In some embodiments, the solder bump may be formed by plating a solder layer with photolithography technologies followed by reflowing processes.

After the bump formation, for example, a singulation process may be performed to singulate individual integrated circuit structure 100, and wafer-level or die-level stacking or the like may be performed. It should be noted, however, that embodiments may be used in many different situations. For example, embodiments may be used in a die-to-die bonding configuration, a die-to-wafer bonding configuration, a wafer-to-wafer bonding configuration, die-level packaging, wafer-level packaging, or the like.

FIG. 12 to FIG. 16 illustrate cross sectional views of intermediate stages in the manufacturing of a semiconductor package according to some embodiments of the present disclosure. In some embodiments, after being singulated, the integrated circuit structure 100 may be further processed to form a semiconductor package. FIG. 12 to FIG. 16 illustrate one of the manufacturing process that can be applied to the integrated circuit structure 100 to form one of the possible semiconductor packages. As one of ordinary skill in the art will recognize, there are many other suitable processes that are suitable for the formation of the semiconductor package having the integrated circuit structure in the disclosure. Like reference numbers and characters in the figures below refer to like components. It is noted that the integrated circuit structure 100 described above are illustrated in an abstract form as a block in FIG. 12 to FIG. 16 for convenience of illustration. Detail illustration and description of same or similar features may be omitted, and may be referred to previous contents in the disclosure.

Figures 12, 13:
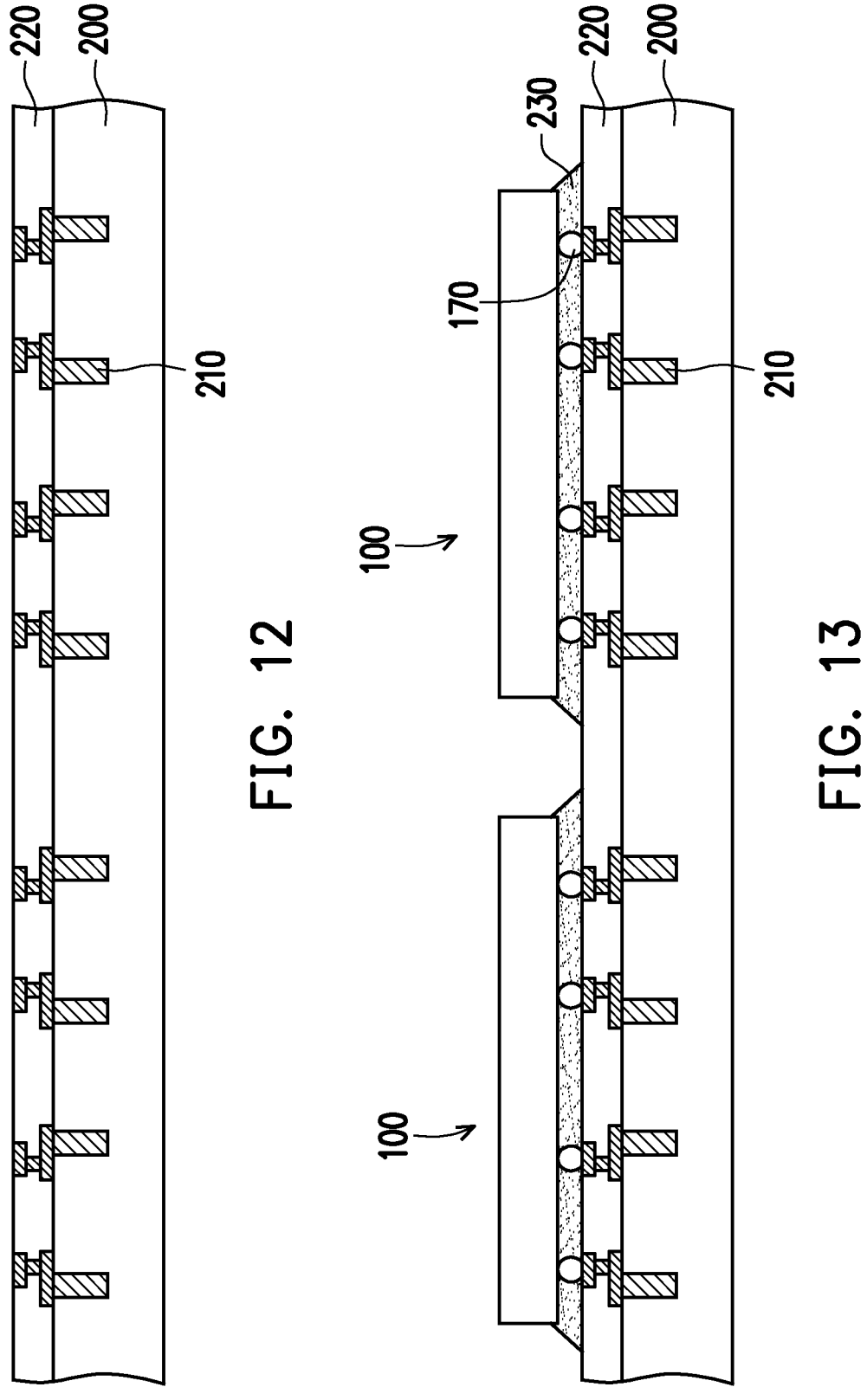
FIG. 12 to FIG. 16 illustrate cross sectional views of intermediate stages in the manufacturing of a semiconductor package according to some embodiments of the present disclosure.

With now reference to FIG. 12, in some embodiments, an interposer (interconnect structure) 200 as shown in FIG. 12 is provided. For example, the substrate of the interposer 200 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the interposer 200 may be a SOI substrate. Generally, an SOI substrate includes a layer of a semiconductor material such as epitaxial silicon, germanium, silicon germanium, SOI, SGOI, or combinations thereof. The interposer 200 is, in one alternative embodiment, based on an insulating core such as a fiberglass reinforced resin core. One example core material is fiberglass resin such as FR4. Alternatives for the core material include bismaleimide-triazine (BT) resin, or alternatively, other PC board materials or films. Build up films such as Ajinomoto build-up film (ABF) or other laminates may be used for interposer 200. In other embodiments, the interposer 200 may be made of organic material and can be seen as a redistribution layer (RDL) including one or more dielectric layer(s) and respective metallization pattern(s) in the dielectric layer(s).

In some embodiments, the interposer 200 may include passive devices formed in and/or on, for example, a front side of the substrate. In other embodiments, the interposer 200 may include active and passive devices (not shown in FIG. 11) formed in and/or on, for example, the front side. As one of ordinary skill in the art will recognize, a wide variety of devices such as transistors, capacitors, resistors, combinations of these, and the like may be used to provide the structural and functional designs for the interposer 200. The devices may be formed using any suitable methods.

In some embodiments, a plurality of through vias 210 are formed to extend from the front side into the interposer 200. The through vias 210 are also sometimes referred to as through-substrate vias or through-silicon vias when the interposer is a silicon interposer. It is noted that the through vias 210, at this stage, are still buried in the interposer 200 and does not extend through the interposer 200. The through vias 210 may be formed by forming recesses in the interposer 200 by, for example, etching, milling, laser techniques, the like, or a combination thereof. A thin barrier layer may be conformally deposited over the front side of the interposer 200 and in the openings, such as by CVD, ALD, PVD, thermal oxidation, the like, or a combination thereof. The barrier layer may comprise a nitride or an oxynitride, such as titanium nitride, titanium oxynitride, tantalum nitride, tantalum oxynitride, tungsten nitride, the like, or a combination thereof. A conductive material may be deposited over the thin barrier layer and in the openings. The conductive material may be formed by an electro-chemical plating process, CVD, ALD, PVD, the like, or a combination thereof. Examples of conductive materials are copper, tungsten, aluminum, silver, gold, the like, or a combination thereof. Excess conductive material and barrier layer is removed from the front side of the interposer 200 by, for example, a CMP. Thus, the through vias 210 may include a conductive material and a thin barrier layer between the conductive material and the substrate of the interposer 200.

In some embodiments, a redistribution structure 220 is formed over the front side of the interposer 200, and is used to electrically connect the integrated circuit devices, if any, and/or the through vias 210 together and/or to external devices. The redistribution structure 220 may include one or more dielectric layer(s) and respective metallization pattern(s) in the dielectric layer(s). The metallization patterns may comprise vias and/or traces to interconnect any devices and/or through vias 210 together and/or to an external device. The metallization patterns are sometimes referred to as redistribution lines. The dielectric layers may comprise silicon oxide, silicon nitride, silicon carbide, silicon oxynitride, low-K dielectric material, such as PSG, BPSG, FSG, SiOxCy, Spin-On-Glass, Spin-On-Polymers, silicon carbon material, compounds thereof, composites thereof, combinations thereof, or the like. The dielectric layers may be deposited by any suitable method known in the art, such as spinning, CVD, PECVD, HDP-CVD, or the like. A metallization pattern may be formed in the dielectric layer, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer corresponding to the exposed portions of the dielectric layer. The recesses and/or openings may be lined with a diffusion barrier layer and filled with a conductive material. The diffusion barrier layer may comprise one or more layers of TaN, Ta, TiN, Ti, CoW, or the like, deposited by ALD, or the like, and the conductive material may comprise copper, aluminum, tungsten, silver, and combinations thereof, or the like, deposited by CVD, PVC, or the like. Any excessive diffusion barrier layer and/or conductive material on the dielectric layer may be removed, such as by using a CMP.

With now reference to FIG. 13, a plurality of integrated circuit structure 100 are mounted to the front side of the interposer 200, for example, through flip-chip bonding. The conductive bumps 170 of the integrated circuit structures 100 electrically couple the circuits in the integrated circuit structures 100 to the redistribution structure 220 and the through vias 210 of the interposer 200. It is noted that two of the integrated circuit structures 100 are illustrated in FIG. 12 to FIG. 16. However, one of ordinary skill in the art will recognize that there may be more or less integrated circuit structures 100 disposed over the interposer 200.

In some embodiments, the integrated circuit structure 100 may be a logic die, such as a central processing unit (CPU), a graphics processing unit (GPU), the like, or a combination thereof. In some embodiments, the integrated circuit structure 100 may include a die stack (not shown) which may include memory die stack or a stack of logic dies and memory dies. In other embodiments, the integrated circuit structure 100 may include an input/output (I/O) die, such as a wide I/O die.

The bonding between the integrated circuit structures 100 and the redistribution structure 220 may be a solder bonding or a direct metal-to-metal (such as a copper-to-copper or tin-to-tin) bonding. In an embodiment, the integrated circuit structures 100 are bonded to the redistribution structure 220 by a reflow process. During this reflow process, the conductive bumps 170 are in contact with the bond pads 222 and the redistribution structure 220 to physically and electrically couple the integrated circuit structures 100 to the redistribution structure 220. An underfill material 230 may be injected or otherwise formed in the space between the integrated circuit structures 100 and the redistribution structure 220 and surrounding the conductive bumps 170. The underfill material 230 may, for example, be a liquid epoxy, deformable gel, silicon rubber, or the like, that is dispensed between the structures, and then cured to harden. This underfill material is used, among other things, to reduce damage to and to protect the conductive bumps 170.

Figures 14, 15:
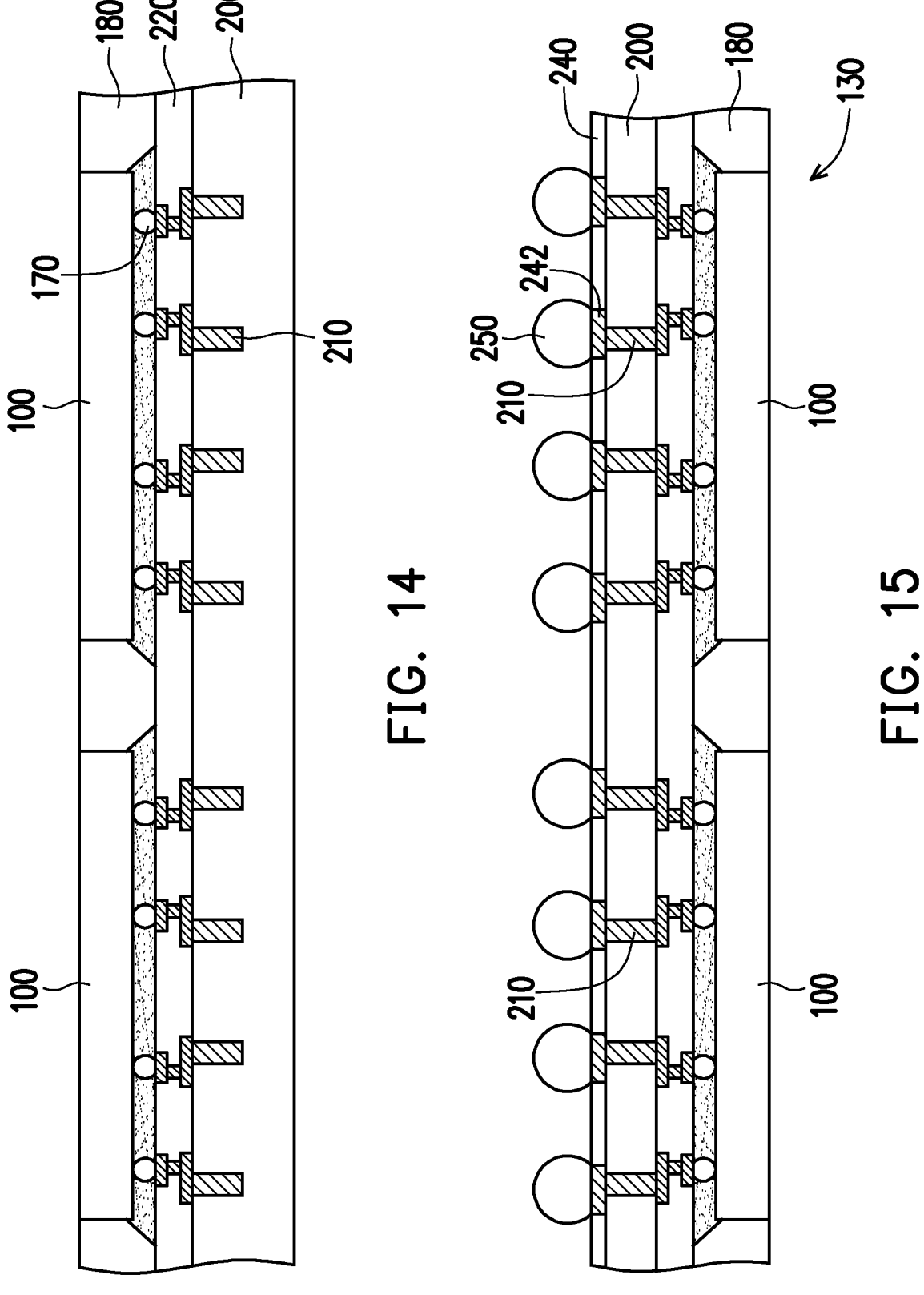

With now reference to FIG. 14, in some embodiments, after the integrated circuit structures 100 are mounted on the interposer 200, the integrated circuit structures 100 may be encapsulated by an encapsulating material 180. The encapsulating material 180 fills the gaps between the integrated circuit structures 100, and may be in contact with the redistribution structure 220. The encapsulating material 180 may be molded on the integrated circuit structures 100, for example, using compression molding. In some embodiments, the encapsulating material 180 is made of a molding compound, a polymer, an epoxy, silicon oxide filler material, the like, or a combination thereof. A curing step may be performed to cure the encapsulating material 180, wherein the curing may be a thermal curing, a Ultra-Violet (UV) curing, the like, or a combination thereof.

In some embodiments, after the encapsulation process, the top surface of encapsulating material 180 may be higher than the back surface of integrated circuit structures 100. Namely, the integrated circuit structures 100 are buried in the encapsulating material 180. Then, a planarization process such as a chemical mechanical polish (CMP) process or a grinding process is performed to grind the encapsulating material 180 until the back surface of the integrated circuit structures 100 are exposed. Other techniques including etching, laser ablation, polishing, and the like could be employed. The resulting structure is shown in FIG. 14. The planarization process is used to planarize the encapsulating material 180 to provide a substantially planar top surface of the encapsulating material 180 and substantially planar back surfaces of the integrated circuit structures 100.

Referring to FIG. 15, in some embodiments, the resultant structure shown in FIG. 14 is then flipped over and the encapsulating material 180 may be adhered to a carrier substrate (not shown) to allow formation of the formation of back side of the interposer 200. The carrier substrate may be any suitable substrate that provides (during intermediary operations of the fabrication process) mechanical support for the components and structures over the carrier substrate. In the formation of the back side of the interposer 200, a thinning process is performed on the back side of the interposer 200 until the through vias 210 are exposed. In an embodiment, the thinning process is a grinding process, although other techniques including etching, laser ablation, polishing, and the like could be employed. At least one dielectric layer(s) 240 may be formed on the back side of the interposer 200. The device pads 242 may be formed on the back side of the interposer 200 and in dielectric layer(s) 240, using similar processes as discussed above.

In some embodiments, a plurality of conductive bumps 250 may also be formed on the back side of interposer 200 and are electrically coupled to the through vias 210. In some embodiments, the conductive bumps 250 may include C4 bumps, solder balls, metal pillars, micro bumps, ENEPIG formed bumps, or the like. In the present embodiment, the conductive bumps 250 are C4 bumps. The conductive bumps 250 may include a conductive material such as solder, copper, aluminum, gold, nickel, silver, palladium, tin, the like, or a combination thereof. The conductive bumps 250 may be formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes.

Figure 16:
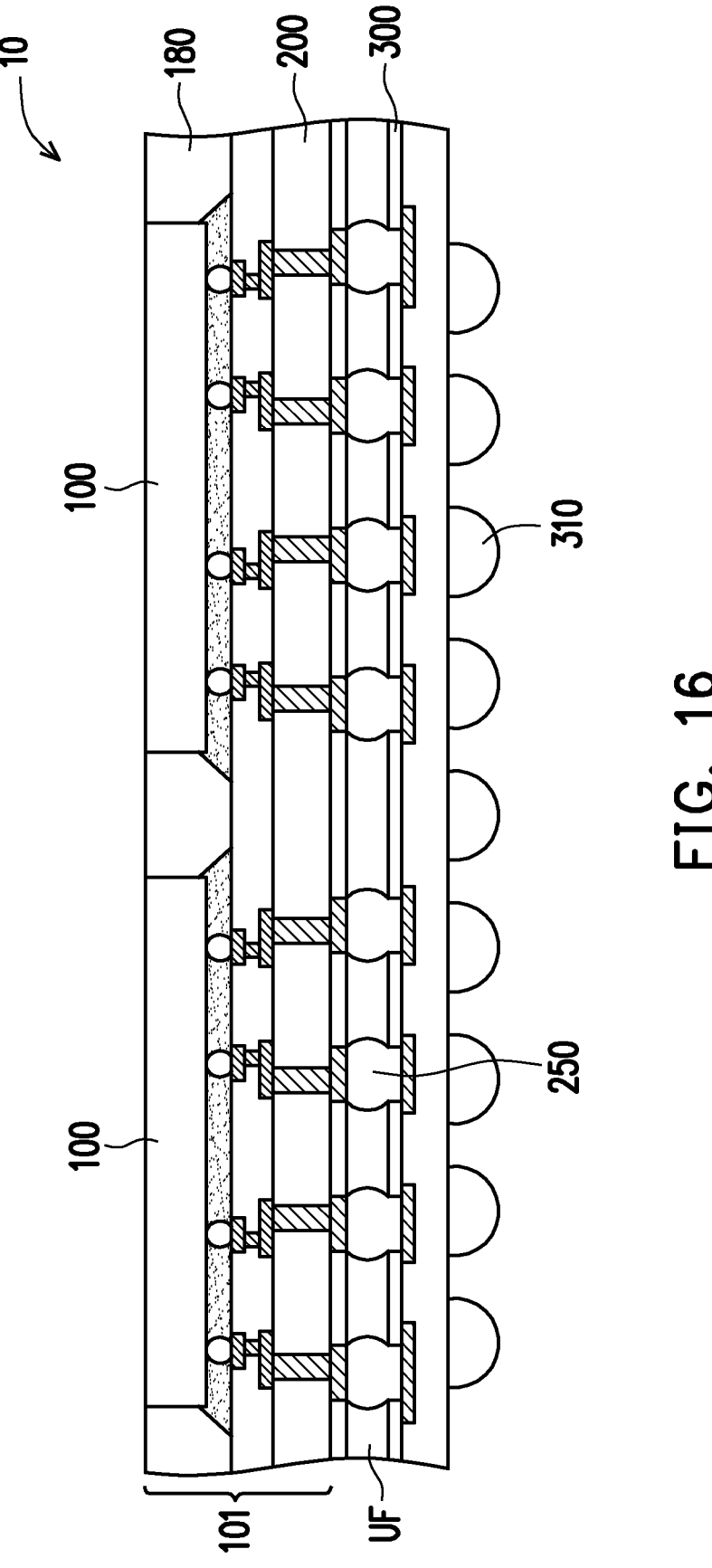

Referring to FIG. 15 and FIG. 16, the resultant structure shown in FIG. 15 can be seen as a composite wafer, which may then be sawed apart into a plurality of encapsulated integrated circuit structures 101, wherein each of the encapsulated integrated circuit structures 101 includes the interposer 200, the integrated circuit structure 100, and encapsulating material 180, etc. Then, the encapsulated integrated circuit structure 101 is placed on the package substrate 300. The conductive bumps 250 are placed on the substrate pads 320 of the package substrate 300. The package substrate 300 may further include contacts 310 (e.g., ball grid array (BGA) balls) disposed on a surface opposite to the package in accordance with various embodiments. Next, a reflow process is performed on the semiconductor package 10 shown in FIG. 16, and the conductive bumps 250 are reflowed. The encapsulated integrated circuit structures 101 and the package substrate 300 are thus bonded to each other through flip-chip bonding. The contacts 310 may be used to electrically connect the package 10 to a motherboard (not shown) or another device component of an electrical system. The resulting package is referred to as semiconductor package 10.

Figure 17:
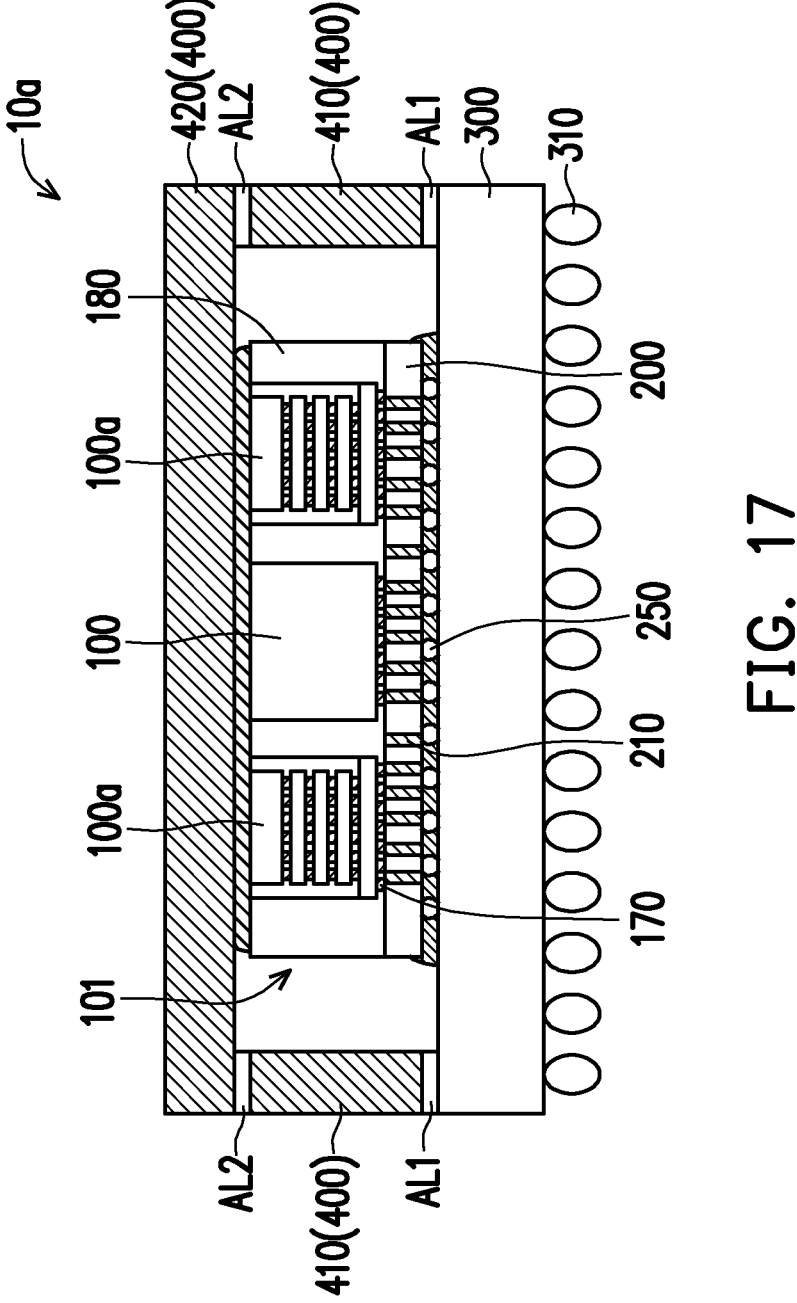
FIG. 17 illustrates a schematic cross sectional view of a semiconductor package according to some embodiments of the present disclosure.

FIG. 17 illustrates a schematic cross sectional view of a semiconductor package according to some embodiments of the present disclosure. FIG. 17 illustrates one of the possible semiconductor packages that could incorporate the integrated circuit structure 100. As one of ordinary skill in the art will recognize, there are many other packages that are suitable for incorporating the integrated circuit structure 100, and the disclosure is not limited thereto. Like reference numbers and characters in the figures below refer to like components. It is noted that the integrated circuit structure 100 described above are illustrated in an abstract form as a block in FIG. 17 for convenience of illustration. Detail illustration and description of same or similar features may be omitted, and may be referred to previous contents in the disclosure.

Referring to FIG. 17, in some embodiments, a package 10*a* including the integrated circuit structure 100 disposed between a plurality of integrated circuit structures 100*a* are provided. In some embodiments, the integrated circuit structure 100 may be a single system on chip (SoC) die, multiple SoC stacked dies, or the like, which is high-power consuming die and may consume a relatively high amount of power, and hence generate a relatively large amount of heat, compared to the integrated circuit structures 100*a*. In some embodiments, the integrated circuit structures 100*a* may be HBM (high bandwidth memory) and/or HMC (high memory cube) modules, which may include memory dies bonded to a logic die. In alternative embodiments, the integrated circuit structures 100 and 100*a* may be other chips having other functions. The integrated circuit structures 100 and 100*a* may have the same or similar layout as the uppermost protective layer (e.g., the second protective layer 150 shown in FIG. 1) covering outer edges of the rest of the protective layers (e.g., the first and third protective layers 140, 160 shown in FIG. 1) underneath.

As illustrated by FIG. 17, the integrated circuit structures 100 and 100*a* are bonded to a top surface of a package component (e.g., interposer 200) through the conductive bumps 170, which may be micro bumps. In alternative embodiments, the integrated circuit structures 100 and 100*a* may be bonded to a different package component such as a substrate, a printed circuit board (PCB), or the like. In accordance with some embodiments of the disclosure, the interposer 200 may be a wafer having interconnect structures for electrically connecting active devices (not shown) in the integrated circuit structures 100 and 100*a* to form functional circuits. The conductive bumps 170 of the integrated circuit structures 100 and 100*a* are electrically connected to bonding pads on a top side of interposer 200. One of the through substrate vias (TSVs) 210 may electrically connect to one of the conductive bumps 250 on a backside of interposer 200 in accordance with various embodiments. In an embodiment, the conductive bumps 250 may be controlled collapse chip connection (C4) bumps including solder. The conductive bumps 250 may have a larger critical dimension (e.g., pitch) than the conductive bumps 170. Other configurations of interposer 200 may also be used. The integrated circuit structures 100 and 100*a* may be encapsulated in an encapsulating material 180 in accordance with various embodiments.

In some embodiments, the package is then bonded to the package substrate 300 using the conductive bumps 250. The resulting chip on wafer on substrate (CoWoS) package is illustrated in FIG. 17. The package substrate 300, as previously described, may be any suitable package substrate, such as a printed circuit board (PCB), an organic substrate, a ceramic substrate, a motherboard, or the like. The package substrate 300 may be used to interconnect the package with other packages/devices to form functional circuits. In some embodiments, these other packages and devices may also be disposed on a surface of the package substrate 300. The package substrate 300 may further include contacts 310 (e.g., ball grid array (BGA) balls) disposed on a surface opposite to the package in accordance with various embodiments. The contacts 310 may be used to electrically connect the package 10*a* to a motherboard (not shown) or another device component of an electrical system. Accordingly, a cover 400 including a ring portion 410 and the lid portion 420 is disposed over the package substrate 300 for surrounding and covering the integrated circuit structures 100 and 100*a* to provide mechanical strength to the package 10*a*. In some embodiments, the cover 400 is thermally conductive, and formed of metals such as copper, aluminum, or the like, for heat dissipation purpose.

In some embodiments, the cover 400 may be bonded over the package substrate 300 through an adhesive layer AL1. For example, the adhesive layer AL1 may include a thermal interface material (TIM) dispensed on to the top surface of the package substrate 300. TIM has a relatively higher thermal conductivity (hence the name) than typical adhesive materials. In some embodiments, the adhesive layer AL1 may include an organic material, and may also act as an adhesive. In some embodiments, the adhesive layer AL1 may include a polymer matrix, a phase change polymer, a silicone-based matrix, a matrix additive (fluxing agent), a filler material (a metallic core with an organic solderability preservative coating), or the like. In some embodiments, the lid portion 420 may be attached to package substrate 300 through an adhesive layer AL2. The adhesive layer 430 may include a material that is selected from the same group of candidate materials of adhesive layer AL1. In some embodiments, the adhesive layer AL2 may also include thermal interface material and be disposed between the lid portion 420 and the ring portion 410. In an alternative embodiment, the cover 400 can be integrally formed without the adhesive layer AL2 bonded between the ring portion 410 and the lid portion 420.

Based on the above discussions, it can be seen that the present disclosure offers various advantages. It is understood, however, that not all advantages are necessarily discussed herein, and other embodiments may offer different advantages, and that no particular advantage is required for all embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the disclosure, an integrated circuit structure includes a semiconductor substrate, a passivation layer, a first protective layer, and a second protective layer. The passivation layer is over the semiconductor substrate. The first protective layer is over the passivation layer. The second protective layer is over the first protective layer, wherein a boundary of the first protective layer is confined within the second protective layer.

In accordance with some embodiments of the disclosure, an integrated circuit structure includes a semiconductor substrate, a conductive layer, a passivation layer, a first protective layer, and a second protective layer. The conductive layer is over the semiconductor substrate. The passivation layer partially covers the conductive layer. The first protective layer is over the passivation layer. The second protective layer covers the first protective layer and an interface between the first protective layer and the passivation layer.

In accordance with some embodiments of the disclosure, a manufacturing method of an integrated circuit structure includes the following steps. A conductive layer is formed over a semiconductor substrate. A passivation layer is formed over the conductive layer, wherein the passivation layer partially covers the conductive layer. A first protective layer is formed over the passivation layer, wherein the first protective layer reveals a periphery of the passivation layer. A second protective layer is formed over the first protective layer, wherein the second protective layer covers the first protective layer and a part of the periphery of the passivation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure, comprising:
   a semiconductor substrate;
   a passivation layer over the semiconductor substrate;
   a first protective layer over the passivation layer;
   a second protective layer over the first protective layer, wherein a boundary of the first protective layer is confined within the second protective layer; and
   a seal ring over a periphery of the semiconductor substrate, wherein the passivation layer covers the seal ring and comprises a protruded portion conforming to a contour of the seal ring, and the first protective layer is spaced apart from the protruded portion.

2. The integrated circuit structure as claimed in claim 1, wherein a material of the second protective layer is the same as a material of the first protective layer.

3. The integrated circuit structure as claimed in claim 1, wherein the second protective layer is interposed between the first protective layer and the protruded portion.

4. The integrated circuit structure as claimed in claim 1, further comprising:
   a third protective layer disposed between the first protective layer and the second protective layer, wherein the second protective layer is in contact with an outer edge of the third protective layer and covers an interface between the first protective layer and the third protective layer.

5. An integrated circuit structure, comprising:
   a semiconductor substrate;
   a passivation layer over the semiconductor substrate;
   a first protective layer over the passivation layer;
   a second protective layer over the first protective layer, wherein a boundary of the first protective layer is confined within the second protective layer; and
   a seal ring over a periphery of the semiconductor substrate, wherein the passivation layer covers the seal ring.

6. The integrated circuit structure as claimed in claim 5, wherein the second protective layer is in contact with an outer edge of the first protective layer and covers an interface between the first protective layer and the passivation layer.

7. The integrated circuit structure as claimed in claim 5, wherein the first protective layer is completely overlapped with the second protective layer from a top view.

8. The integrated circuit structure as claimed in claim 5, further comprising:

a third protective layer disposed between the first protective layer and the second protective layer, wherein the second protective layer is in contact with an outer edge of the third protective layer and covers an interface between the first protective layer and the third protective layer.

9. The integrated circuit structure as claimed in claim 5, further comprising:

a plurality of conductive bumps over and partially embedded in the second protective layer.

10. The integrated circuit structure as claimed in claim 5, wherein the second protective layer is overlapped with the seal ring from a top view.

11. The integrated circuit structure as claimed in claim 10, wherein the passivation layer is disposed over the seal ring and comprises a protruded portion covering and conforming to a contour of the seal ring, and the first protective layer is spaced apart from the protruded portion.

12. The integrated circuit structure as claimed in claim 11, wherein the second protective layer covers a part of the protruded portion and the passivation layer between the first protective layer and the protruded portion.

13. An integrated circuit structure, comprising:

a semiconductor substrate;

a conductive layer over the semiconductor substrate, wherein the conductive layer comprises a seal ring over a periphery of the semiconductor substrate;

a passivation layer covering the seal ring in a conformal manner;

a first protective layer over the passivation layer; and a second protective layer covering the first protective layer and an interface between the first protective layer and the passivation layer.

14. The integrated circuit structure as claimed in claim 13, wherein an outer edge of the second protective layer is a planar surface extended from an upper surface of the second protective layer to the passivation layer.

15. The integrated circuit structure as claimed in claim 13, further comprising:

a plurality of conductive bumps over and partially embedded in the second protective layer, wherein the plurality of conductive bumps are electrically connected to the conductive layer.

16. The integrated circuit structure as claimed in claim 13, further comprising:

a third protective layer disposed between the first protective layer and the second protective layer, wherein the second protective layer at least covers an outer edge of the third protective layer and an interface between the first protective layer and the third protective layer.

17. The integrated circuit structure as claimed in claim 16, wherein the third protective layer reveals a periphery of the first protective layer, which is covered by the second protective layer.

18. The integrated circuit structure as claimed in claim 13, wherein the second protective layer is overlapped with the seal ring from a top view.

19. The integrated circuit structure as claimed in claim 18, wherein the passivation layer is disposed over the seal ring and comprises a protruded portion covering and conforming to a contour of the seal ring, and the first protective layer is spaced apart from the protruded portion.

20. The integrated circuit structure as claimed in claim 19, wherein the second protective layer covers a space between the first protective layer and the protruded portion and a part of the protruded portion.

* * * * *